US007183559B2

(12) United States Patent
Luten et al.

(10) Patent No.: US 7,183,559 B2
(45) Date of Patent: Feb. 27, 2007

(54) ION SOURCE WITH SUBSTANTIALLY PLANAR DESIGN

(75) Inventors: Henry A. Luten, Ypsilanti, MI (US); Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 10/986,456

(22) Filed: Nov. 12, 2004

(65) Prior Publication Data
US 2006/0103319 A1 May 18, 2006

(51) Int. Cl.
*H01J 27/00* (2006.01)
(52) U.S. Cl. .................. 250/423 R; 250/427
(58) Field of Classification Search .......... 315/111.01–111.91; 250/423, 423 R, 423 F, 250/427; 118/723
See application file for complete search history.

(56) References Cited

U.S. PATENT DOCUMENTS

| 5,656,819 | A |   | 8/1997 | Greenly ............. 250/423 |
|---|---|---|---|---|
| 6,002,208 | A |   | 12/1999 | Maishev et al. ....... 315/111.91 |
| 6,037,717 | A |   | 3/2000 | Maishev et al. ....... 315/111.91 |
| 6,147,354 | A | * | 11/2000 | Maishev et al. ....... 250/423 R |
| 6,153,067 | A |   | 11/2000 | Maishev et al. ....... 204/298.04 |
| 6,242,749 | B1 | * | 6/2001 | Maishev et al. ....... 250/423 R |
| 6,246,059 | B1 | * | 6/2001 | Maishev et al. ....... 250/426 |
| 6,359,388 | B1 | * | 3/2002 | Petrmichl ............. 315/111.81 |
| RE38,358 | E |   | 12/2003 | Petrmichl |
| 6,664,739 | B1 | * | 12/2003 | Kishinevsky et al. ... 315/111.41 |
| 6,740,211 | B2 |   | 5/2004 | Thomsen et al. ....... 204/192.27 |
| 6,777,030 | B2 |   | 8/2004 | Veerasamy et al. ..... 427/249.7 |
| 6,806,652 | B1 | * | 10/2004 | Chistyakov ........... 315/111.21 |
| 6,815,690 | B2 | * | 11/2004 | Veerasamy et al. ..... 250/423 R |
| 6,919,672 | B2 | * | 7/2005 | Madocks .............. 313/359.1 |
| 2003/0077402 | A1 |   | 4/2003 | Amann et al. ........... 427/523 |
| 2004/0016640 | A1 | * | 1/2004 | Veerasamy et al. ..... 204/298.19 |
| 2004/0074444 | A1 | * | 4/2004 | Vererasamy et al. .... 118/723 FI |
| 2004/0075060 | A1 | * | 4/2004 | Luten et al. .......... 250/423 R |
| 2005/0040031 | A1 | * | 2/2005 | Burtner et al. ........ 204/192.12 |
| 2005/0082493 | A1 | * | 4/2005 | Petrmichi ............. 250/423 R |
| 2005/0104007 | A1 | * | 5/2005 | Veerasamy et al. ..... 250/423 R |

OTHER PUBLICATIONS

"Superconducting Magnetic Hall Effect Ion Source", IBM Technical Disclosure Bulletin, vol. 35, No. 3, Aug. 1992 (p. 345-346).

* cited by examiner

*Primary Examiner*—Hoanganh Le
*Assistant Examiner*—Tung Le
(74) *Attorney, Agent, or Firm*—Nixon & Vanderhye P.C.

(57) ABSTRACT

In certain example embodiments of this invention, there is provide an ion source including an anode and a cathode. In certain example embodiments, the cathode does not overhang over the anode, or vice versa. Since no, or fewer, areas of overhang are provided between the anode and cathode, there is less undesirable build-up on the anode and/or cathode during operation of the ion source so that the source can run more efficiently. Moreover, in certain example embodiments, an insulator such as a ceramic or the like is provided between the anode and cathode.

35 Claims, 5 Drawing Sheets

ION SOURCE WITH SUBSTANTIALLY PLANAR DESIGN

This invention relates to an ion source having an improved design which aids in cleaning and/or operation. In certain example embodiments, the ion source comprises a substantially planar design so that there is no or substantially no area where the cathode overhangs the anode.

BACKGROUND OF THE INVENTION

An ion source is a device that causes gas molecules to be ionized and then accelerates and emits the ionized gas molecules and/or atoms toward a substrate. Such an ion source may be used for various purposes, including but not limited to cleaning a substrate, surface activation, polishing, etching, and/or deposition of thin film coatings/layer(s). Example ion sources are disclosed, for example, in U.S. Pat. Nos. 6,359,388; 6,037,717; 6,002,208; and 5,656,819, the disclosures of which are all hereby incorporated herein by reference.

FIGS. 1–2 illustrate a conventional Hall-effect, anode layer ion source. In particular, FIG. 1 is a side cross-sectional view of an ion beam source with an ion beam emitting slit defined in the cathode, and FIG. 2 is a corresponding sectional plan view along section line II—II of FIG. 1. FIG. 3 is a sectional plan view similar to FIG. 2, for purposes of illustrating that the FIG. 1 ion beam source may have an oval and/or racetrack-shaped ion beam emitting slit as opposed to a circular ion beam emitting slit. Any other suitable shape may also be used.

Referring to FIGS. 1–3, the ion source includes a hollow housing made of a highly magnetoconductive (or permeable) material such as iron, which is used as a cathode 5. Cathode 5 includes cylindrical or oval side wall 7, a closed or partially closed bottom wall 9, and an approximately flat top wall 11 in which a circular or oval ion emitting slit and/or aperture 15 is defined. The bottom 9 and side wall(s) 7 of the cathode are optional. Ion emitting slit/aperture 15 includes an inner periphery as well as an outer periphery.

Deposition and/or plasma maintenance gas supply aperture or hole(s) 21 is/are formed in bottom wall 9. Flat top wall 11 functions as an accelerating electrode. A magnetic system including a cylindrical permanent magnet 23 with poles N and S of opposite polarity is placed inside the housing between bottom wall 9 and top wall 11. The purpose of the magnetic system with a closed magnetic circuit formed by the magnet 23 and cathode 5 is to induce a substantially transverse magnetic field (MF) in an area proximate ion emitting slit 15. The ion source may be entirely or partially within wall 50. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulative ring 31 (e.g., of ceramic). Anode 25 defines a central opening therein in which magnet 23 is located. The negative pole of electric power source 29 is connected to cathode 5, so that the cathode is negative with respect to the anode (e.g., the cathode may be grounded). FIG. 1 illustrates that portions of both the inner and outer cathode 5 portions overhang parts of the anode 25, thereby creating areas of overhang OH.

Generally speaking, the anode 25 is generally biased positive by several hundred to a few thousand volts. Meanwhile, the cathode (the term "cathode" as used herein includes the inner and/or outer portions thereof) is generally held at, or close to, ground potential. This is the case during all aspects of source operation, including during a mode in which the source is being cleaned.

The conventional ion beam source of FIGS. 1–3 is intended for the formation of a unilaterally directed tubular (in the case of a standard beam collimated mode for example) ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment.

The conventional ion beam source of FIGS. 1–3 operates as follows in a depositing mode when it is desired to ion beam deposit a layer(s) on substrate 45. A vacuum chamber in which the substrate 45 and slit/aperture 15 are located is evacuated to a pressure less than atmospheric, and a depositing gas (e.g., a hydrocarbon gas such as acetylene, or the like) is fed into the interior of the source via gas aperture(s) 21 or in any other suitable manner. A maintenance gas (e.g., argon) may also be fed into the source in certain instances, along with the depositing gas. Power supply 29 is activated and an electric field is generated between anode 25 and cathode 5, which accelerates electrons to high energy. Anode 25 is positively biased by several hundred to a few thousand volts, and cathode 5 is at ground potential or proximate thereto as shown in FIG. 1. Electron collisions with the gas in or proximate aperture/slit 15 leads to ionization and plasma is generated. "Plasma" herein means a cloud of gas including ions of a material to be accelerated toward substrate 45. The plasma expands and fills (or at least partially fills) a region including slit/aperture 15. An electric field is produced in slit 15, oriented in the direction substantially perpendicular to the transverse magnetic field, which causes the ions to propagate toward substrate 45. Electrons in the ion acceleration space in and/or proximate slit/aperture 15 are propelled by the known E×B drift (Hall current) in a closed loop path within the region of crossed electric and magnetic field lines proximate slit/aperture 15. These circulating electrons contribute to ionization of the gas (the term "gas" as used herein means at least one gas), so that the zone of ionizing collisions extends beyond the electrical gap between the anode and cathode and includes the region proximate slit/aperture 15 on one and/or both sides of the cathode 5.

For purposes of example, consider the situation where a silane and/or acetylene ($C_2H_2$) depositing gas is/are utilized by the ion source of FIGS. 1–3 in a depositing mode. The silane and/or acetylene depositing gas passes through the gap between anode 25 and cathode 5. Unfortunately, certain of the elements in acetylene and/or silane gas is/are insulative in nature (e.g., carbide may be an insulator in certain applications).

Insulating deposits (e.g., carbide deposits, carbon deposits, and/or oxide deposits which may be insulating or semi-insulating in nature) resulting from the depositing gas can quickly build up on the respective surfaces of anode 25 and/or cathode 5 proximate the gap therebetween, and/or at other electrode locations. Unfortunately, the fact that both the inner and outer cathode 5 portions overhang parts of the anode 25 as shown in FIG. 1 causes even more deposits to build up on the portions of the anode 25 and cathode 5 in the areas of overhang OH. This can interfere with gas flow through the gap and/or aperture 15, and/or it can reduce net current thereby adversely affecting the electric field potential between the anode and cathode proximate slit/aperture 15. Such deposits resistively limit the amount of current that can flow through the source; this adversely interferes with the operability and/or efficiency of the ion source especially over significant lengths of time. This unfortunately can also result in micro-particles from the deposits making their way into a film being deposited on the substrate. In either case, operability and/or efficiency of the ion beam source is adversely affected.

In view of the above, it will be apparent to those skilled in the art that there exists a need for an ion beam design which leads to less undesirable build-up on the anode and/or cathode, and/or which more efficiently permits high current operation of the ion source at low potential yielding a high flux of ions toward the substrate. In certain example situations, a design that permits rapid in situ removal of build-up is also desirable.

BRIEF SUMMARY OF EXAMPLE EMBODIMENTS OF THE INVENTION

In certain example embodiments of this invention, there is provided an ion source including an anode and a cathode. In certain example embodiments, the cathode does not substantially overhang over the anode, or vice versa. Since no, or fewer, areas of overhang are provided between the anode and cathode, there is less undesirable build-up on the anode and/or cathode during operation of the ion source so that the source can run more efficiently. Moreover, in certain example embodiments, an insulator such as a ceramic or the like is provided between the anode and cathode.

In certain example embodiments of this invention this substantially planar design, where there is no area of overhang between the anode/cathode on the side of the ion source facing the substrate, is advantageous in that: (a) it permits high current operation at low potential thereby yielding a high flux of potentially low energy ions toward the substrate; (b) the lack or reduction of overhang areas or interior spaces between the anode/cathode reducing the amount of undesirable build-ups on the anode and/or cathode during source operation and thus reduces the required frequency of cleaning and/or duty cycle of the source; and/or (c) it creates an ion source which optimizes the effectiveness of a magnetron mode of cleaning.

In certain example embodiments of this invention, there is provided a ion source comprising a conductive cathode comprising an inner cathode portion and an outer cathode portion in a given plane; an ion emitting gap formed at least partially between the inner cathode portion and the outer cathode portion; an anode located between the inner cathode portion and the outer cathode portion as viewed from above and/or below; and wherein no portion of the inner cathode portion overlaps the anode, and no portion of the outer cathode portion overlaps the anode.

In other example embodiments of this invention, there is provided an ion source comprising an anode and a cathode; wherein a first one of the anode and cathode comprises an inner electrode portion and an outer electrode portion; an ion emitting gap formed at least partially between the inner electrode portion and the outer electrode portion; the other of the anode and cathode located at least partially between the inner electrode portion and the outer electrode portion as viewed from above and/or below; and wherein no portion of the inner electrode portion and/or outer electrode portion overlaps the other of the anode and cathode.

In still further example embodiments of this invention, there is provided an ion source comprising a conductive cathode comprising an inner cathode portion and an outer cathode portion in a given plane; an anode located between the inner cathode portion and the outer cathode portion as viewed from above and/or below; and wherein at least part of the anode is located at an elevation above a bottom-most portion of the inner cathode portion and/or the outer cathode portion, so that at least part of the anode is located directly between the inner cathode portion and the outer cathode portion.

DETAILED DESCRIPTION OF CERTAIN EXAMPLE EMBODIMENTS OF THE INVENTION

Figure 1:
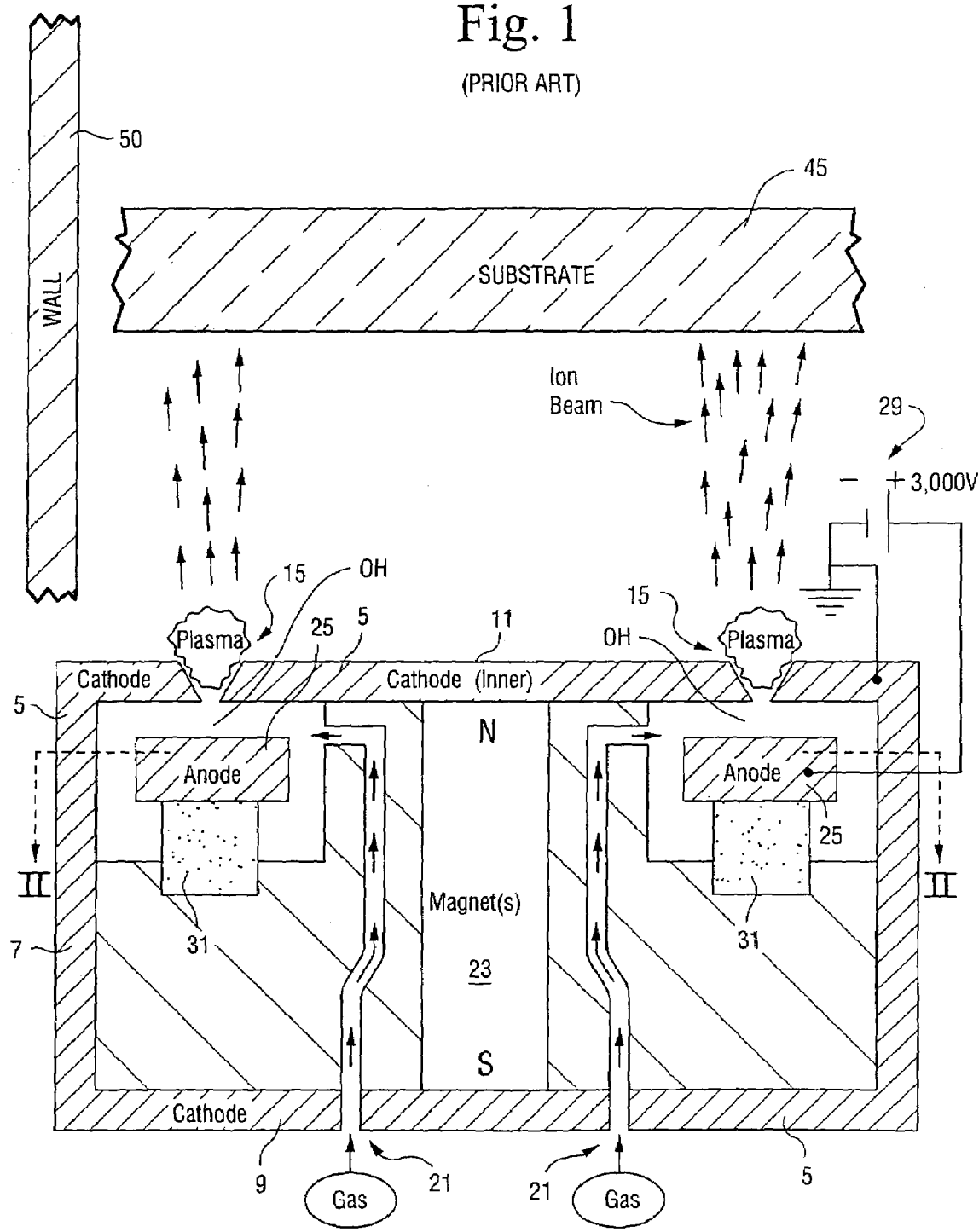
FIG. 1 is a schematic partial cross sectional view of a conventional cold cathode closed drift ion source.

Referring now more particularly to the accompanying drawings, in which like reference numerals indicate like parts throughout the several views. In this respect, reference numerals used in FIGS. 4–5 may be used for the same components discussed above with respect to FIGS. 1–3.

In the following description, for purposes of explanation and not limitation, specific details are set forth in order to provide an understanding of certain embodiments of the present invention. However, it will apparent to those skilled in the art that the present invention may be practiced in other embodiments that depart from these specific details. In other instances, detailed descriptions of well known devices, gases, fasteners, and other components/systems are omitted so as to not obscure the description of the present invention with unnecessary detail.

Certain example embodiments of this invention relate to an ion source having a substantially planar design so that the anode is not substantially overlapped by the cathode, or vice versa. This design is optimized in certain example embodiments for high pressure operation in a manner similar to that known as a diffused mode of operation in a closed-drift, Hall-effect, ion source. In this respect, the ion source in certain example embodiments is a cold cathode closed drift ion source. Operating pressures may be below atmospheric pressure, and may be similar to those of planar and magnetron sputtering systems. In view of example designed discussed herein, high current operation at low potential yielding a high flux of low energy ions toward the substrate is possible. Another example advantage is the lack of interior free unoccupied space between the anode and cathode, which results in less undesirable material build-ups on the anode/cathode during source operation. Accordingly, the ion source requires less frequent cleaning and duty cycle of the source can be improved. Still further, the ion source is much easier to clean due to designs of certain example embodiments of this invention.

Moreover, in certain example embodiments of this invention, the substantially planar design may optimize the effectiveness of magnetron mode cleaning of the ion source where both the anode and cathode of the ion source are negatively biased in order to clean the same. As another example advantage, manual cleaning during a vent cycle will not necessarily require disassembly of the ion source.

Figure 3:
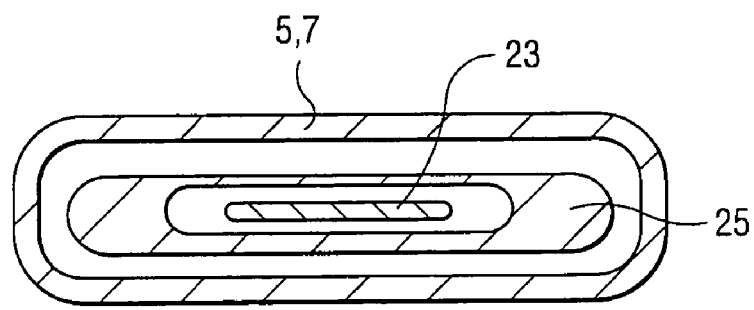
FIG. 3 is a sectional view similar to FIG. 2, taken along section line II in FIG. 1, in another embodiment illustrating that the ion source may be shaped in an oval manner instead of in a circular manner in certain instances.
Figure 4:
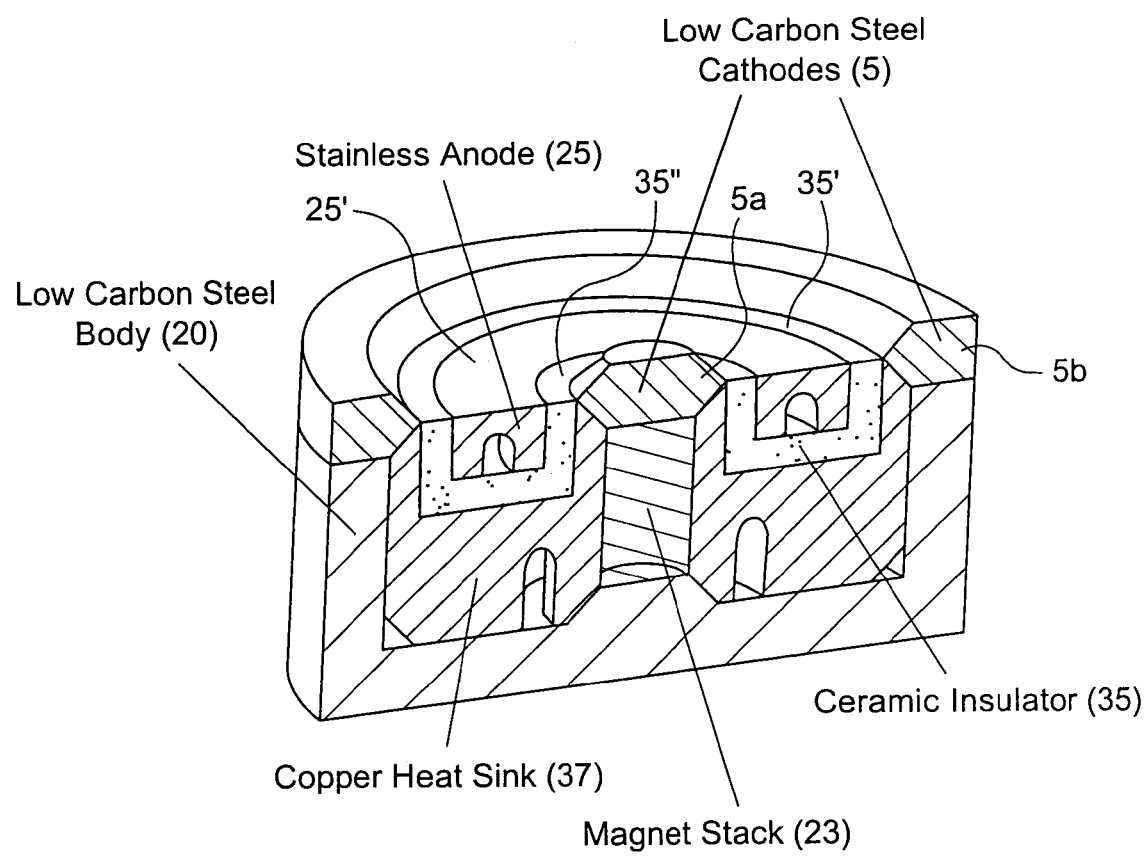
FIG. 4 is a perspective partial cross sectional view of part of an ion source according to an example embodiment of this invention.

FIG. 3 is a perspective and partial cross sectional view of an ion source according to an example embodiment of this invention, and FIG. 4 is a side cross-sectional view of the ion source of FIG. 3. Referring to FIGS. 3–4, the ion source includes a hollow housing 20 made of a highly magneto-conductive material such as low carbon steel, iron, or any other suitable material. This housing may or may not be used as the cathode in certain example embodiments. In other words, the cathode may include body 20 in certain example embodiments and may not in other example embodiments.

The ion source, in a plane proximate the side of the ion source closest to the substrate, includes conductive cathode 5 which includes both inner cathode portion 5a and outer cathode portion 5b. The outer cathode portion 5b surrounds or substantially surrounds the inner cathode portion 5a in certain example embodiments of this invention, and the two may be coaxial in certain example instances. The inner and outer cathodes may be of the same conductive material in certain embodiments, although this invention is not so limited unless expressly claimed. The cathode portions may be circular or oval shaped in different example embodiments of this invention (e.g., see FIGS. 2–3). Between the inner and outer cathode portions 5a and 5b there is provided an ion emitting gap 22 which includes an inner periphery defined by the periphery of the inner cathode portion 5a and an outer periphery defined by the inner periphery of the outer cathode portion 5b.

The ion source of FIGS. 3–4 further includes conductive anode 25 of a material such as stainless steel or any other suitable conductive material. In certain example embodiments, anode 25 is either circular shaped or oval shaped as viewed from above or below, and may be coaxial and/or concentric with the inner and/or outer cathode 5 portions. As viewed from above and/or below, the anode 25 is located between the inner and outer portions (5a and 5b) of the cathode 5 immediately adjacent the ion emitting gap 22, so that a bottom side of the ion emitting gap 22 is defined by the upper surface 25' of the anode 25.

Gas such as argon and/or a hydrocarbon gas like acetylene may be introduced into the ion source via the vacuum/depositing chamber between the source and the substrate as described, for example and without limitation, in U.S. Pat. No. Re 38,358 and/or US Patent Application No. 2004/0074444, the entire disclosures of which are both hereby incorporated herein by reference. One or more gas inlets (not shown) may be used to introduce one or more gases from one or more gas sources 30. An inert gas such as argon or the like may be introduced to the source in such a manner when the ion source is to be used to clean or mill a substrate, while at least a coating gas (e.g., a hydrocarbon gas such as acetylene) may be introduced to the source in such a manner when the source is to be used to deposited a coating such as diamond-like carbon (DLC) on the substrate either directly or indirectly.

A magnetic system including a cylindrical or otherwise shaped magnet(s) 23 with poles N and S of opposite polarity is placed inside the housing under the inner cathode portion 5a, and in the aperture defined by the anode 25 as viewed from above and/or below. In certain example embodiments, the N-pole faces the cathode portion 5a, while the S-pole faces a bottom wall of body 20. The purpose of the magnetic system with a closed magnetic circuit formed by the magnet(s) 23 and cathode 5 is to induce a substantially transverse magnetic field (MF) in an area proximate ion emitting slit gap 25'. Generally speaking, the anode 25 is generally biased positive by several hundred to a few thousand volts. Meanwhile, the cathode (the term "cathode" as used herein includes the inner and/or outer portions thereof) is generally held at, or close to, ground potential, although it may be at any potential that is negative relative to the anode.

Figure 2:
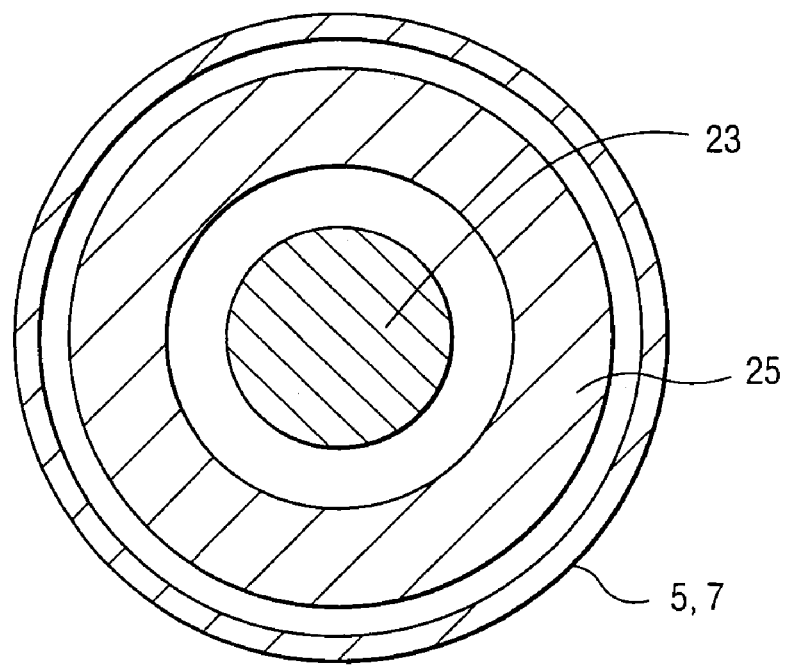
FIG. 2 is a sectional view taken along section line II of FIG. 1.
Figure 5:
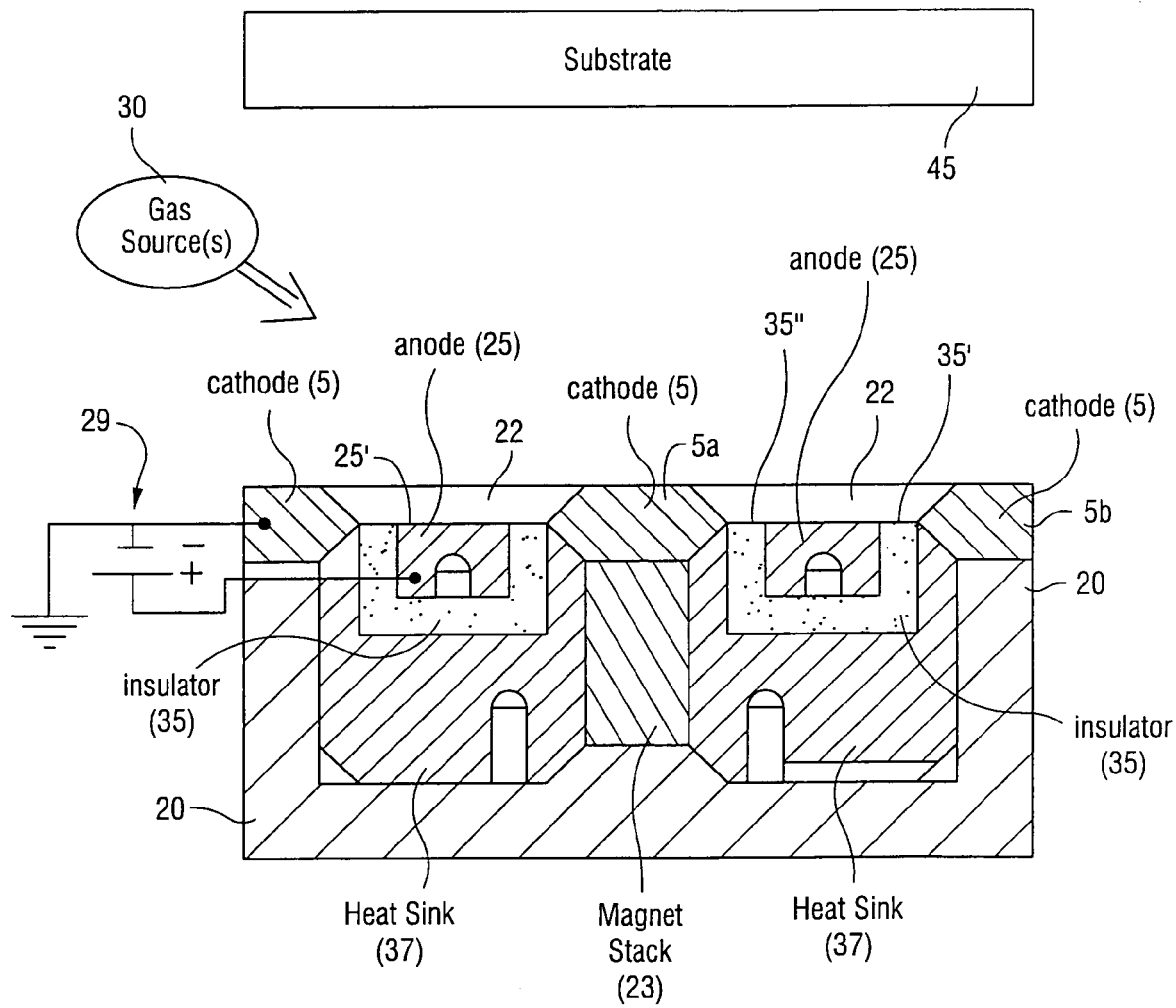
FIG. 5 is a cross sectional view of the ion source of FIG. 4.

FIGS. 4–5 illustrate that in certain embodiments of this invention, the locations of the anode 25 and cathode 5 are substantially planar so that the cathode does not overhang the anode in any respect. In other words, the areas of overhang OH shown in prior art FIG. 1 are not present in the ion source design of FIGS. 4–5. As shown in FIGS. 4–5, in certain example embodiments of this invention, the inner periphery of the outer cathode portion 5b does not extend over or overlap the anode 25 in any respect as viewed from above or below, and/or the outer periphery of the inner cathode portion 5a does not extend over or overlap the anode 25 in any respect as viewed from above or below. This structure also permits, when viewing the source from the side as in FIGS. 4–5, at least part of the anode 25 to be located at an elevation above a bottom-most portion of the inner and/or outer cathode portions (5a and/or 5b) thereby leading to a more efficient ion emitting gap. In certain example embodiments, the upper surface 25' of the anode 25 is located at an elevation at least as high as an area proximate a central portion of the inner cathode portion 5a as shown in FIGS. 4–5. In certain example embodiments, the upper surface 25' of the anode 25 defines a plane which extends through a central area of the inner cathode portion 5a.

However, in certain example embodiments of this invention, the upper surface of the anode 25 does not extend upwardly to an elevation as high as the upper surface of the cathode 5. As a result, there is a slight depression or recess formed in the top surface of the ion source between 5a, 5b and 25. This recess forms at least part of the ion emitting gap 22 discussed herein.

Anode 25 is electrically insulated form cathode 5 via insulator 35, which may be of any suitable insulating material such as a ceramic. In the illustrated example embodiment, insulator 35 is circular or oval in shape as viewed from above and/or below, and is substantially U-shaped as viewed in cross section. From a cross sectional perspective, the anode 25 is located in the hollow of the U of the U-shaped insulator 35 as shown in FIGS. 4–5. Insulating material 35 may be of any suitable material, such as silicon oxide, aluminum oxide, or the like. It is noted that in alternative embodiments of this invention, a ceramic spacer is not necessary, and a dark-space gap may be used between the anode and cathodes/grounded surfaces. Heat sink 37 of a material such as copper is provided below the insulator 35, and the insulator 35 electrically insulates the anode 25 from the heat sink 37. In certain example embodiments of this invention, the insulator 35 substantially surrounds at least three of the four sides of the anode 25 as viewed cross sectionally (e.g., see FIGS. 4–5). Moreover, in certain example embodiments, the heat sink 37 substantially surrounds at least three sides of the insulator 35 as viewed cross sectionally (e.g., see FIGS. 4–5). Likewise, in certain example embodiments, the heat sink 37 substantially surrounds at least three sides of the anode 25 as viewed cross sectionally (e.g., see FIGS. 4–5).

As shown in FIGS. 4–5, in certain example embodiments of this invention, the insulative surface 35' that extends between and contacts each of the anode 25 and the cathode outer portion 5b is substantially planar and defines a plane approximately coplanar with a top surface 25' of the anode 25. Moreover, in certain example embodiments of this invention, the insulative surface 35" that extends between and contacts each of the anode 25 and the cathode inner portion 5a is substantially planar and defines a plane approximately coplanar with a top surface 25' of the anode 25. A side of ion emitting gap 22 is defined partially by insulative surfaces 35' and 35".

Advantageously, high current operation at low potential yielding a high flux of low energy ions toward the substrate is possible; this is sometimes desirable in ion assisted deposition applications or the like. Another example advantage is the lack of interior free unoccupied space between the anode and cathode, which results in less undesirable material build-ups on the anode/cathode during source operation and thus more efficient ion source operation and less frequent cleaning being needed.

For purposes of example and without limitation, the ion source of FIGS. 4–5 may operate as follows in a depositing mode when it is desired to ion beam deposit a layer(s) on substrate 45. A vacuum chamber in which the substrate 45 and gap 22 are located is evacuated to a pressure less than atmospheric, and a depositing gas (e.g., a hydrocarbon gas such as acetylene, or the like) is fed into the chamber. A maintenance gas (e.g., argon) may also be fed into the chamber, along with the depositing gas. Power supply 29 is activated and an electric field is generated between anode 25 and cathode 5, which accelerates electrons to high energy. Anode 25 is positively biased by several thousand volts, and cathode 5 may be at ground potential or proximate thereto. Electron collisions with the gas in or proximate ion emitting gap 22 leads to ionization and a plasma is generated. The plasma expands and fills (or at least partially fills) a region including gap or recess 22. An electric field is produced in gap 22, oriented in the direction substantially perpendicular to the transverse magnetic field, which causes the ions to propagate toward substrate 45. Electrons in the ion acceleration space in and/or proximate gap 22 are propelled by the E×B drift in a closed loop path within the region of crossed electric and magnetic field lines proximate gap 22. These circulating electrons contribute to ionization of the gas, so that the zone of ionizing collisions extends beyond the electrical gap between the anode and cathode and includes the region proximate gap 22 on one and/or both sides of the cathode 5. The ions directed toward the substrate are then capable of forming, or helping form, a coating on the substrate 45 in certain example embodiments of this invention.

The ion beam emitted from the ion source may be a diffused beam in certain example embodiments of this invention. However, in other example embodiments, the ion beam from the ion source may be focused or otherwise shaped/oriented.

Figure 6:
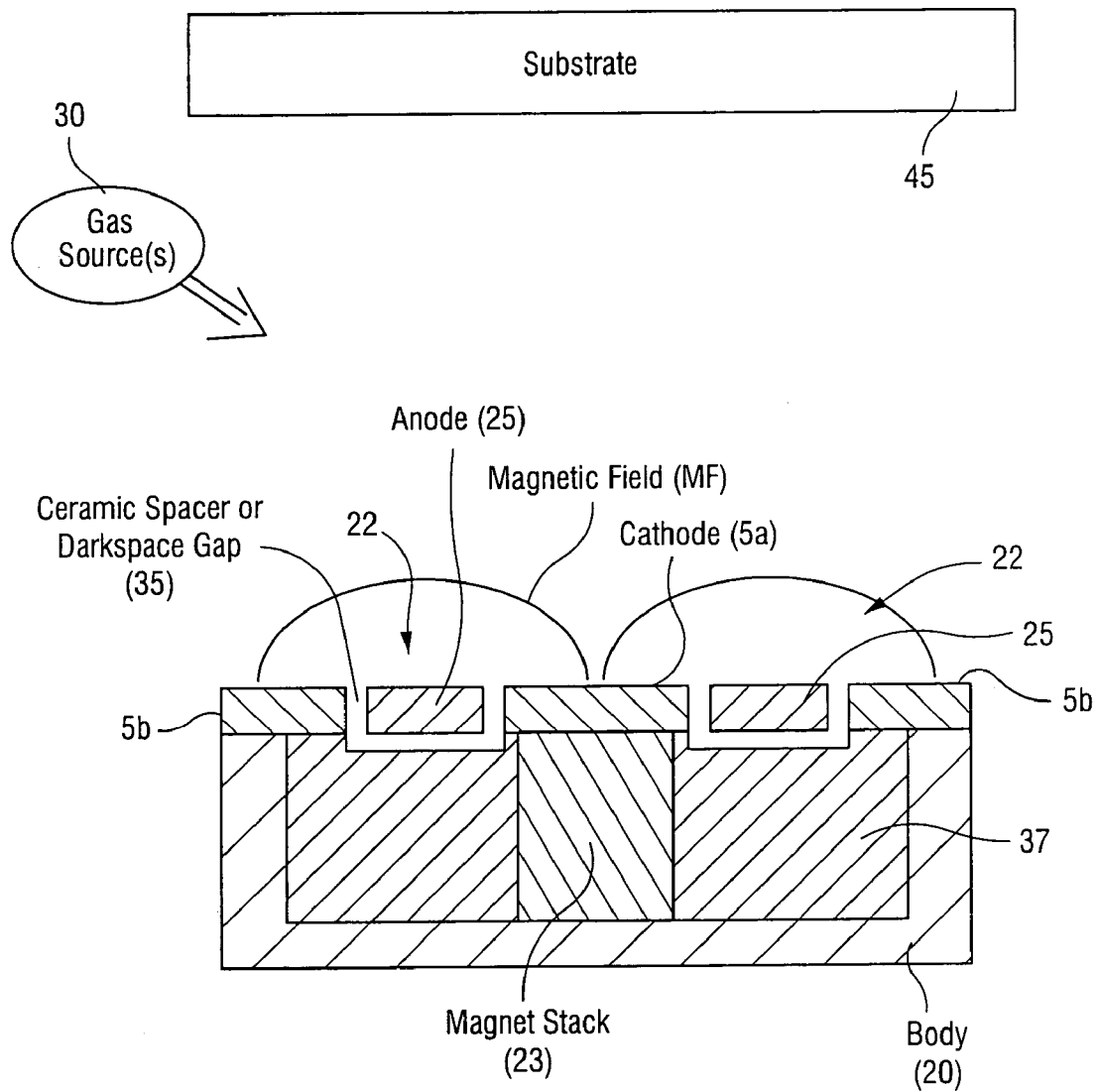
FIG. 6 is a cross sectional view of an ion source according to another example embodiment of this invention.

FIG. 6 is a cross sectional view of an ion source according to another example embodiment of this invention. The FIG. 6 embodiment is similar to the FIG. 4–5 embodiment, in that the cathode portions 5a and 5b do not overlap/overhang the anode as viewed from above and/or below. In the FIG. 6 embodiment, the upper surface of the anode 25 is flush or substantially flush with the upper surface of the cathode 5. In the FIG. 6 embodiment, as in the FIG. 4–5 embodiment, the ion emitting gap 22 is formed at least partially between the inner cathode portion 5a and the outer cathode portion 5b as viewed from above or below (e.g., as viewed from the substrate).

In the aforesaid embodiments it is noted that the magnetic stack 23 is illustrated in the center of the source. However, this need not be the case in alternative embodiments, as the central location is used for convenience only and is not a requirement in all instances. It is further noted that the absolute polarity of the magnetic field (North vs. South) is not particularly important to the function of the source. Moreover, as mentioned above with respect to FIGS. 4–5, the ceramic insulator 35 of FIG. 6 may be replaced with a dark-space gap in certain alternative embodiments of this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. An ion source comprising:
   a conductive cathode comprising an inner cathode portion and an outer cathode portion in a given plane;
   an ion emitting gap formed at least partially between the inner cathode portion and the outer cathode portion of the ion source so that the ion source produces an ion beam directed toward a substrate;
   an anode located between the inner cathode portion and the outer cathode portion as viewed from above and/or below; and
   wherein no portion of the inner cathode portion overlaps the anode, and no portion of the outer cathode portion overlaps the anode.

2. The ion source of claim 1, wherein an upper surface of the anode defines a plane which extends through a central portion of at least the inner cathode portion.

3. The ion source of claim 1, wherein an area between the anode and the cathode is provided with a ceramic insulator.

4. The ion source of claim 1, wherein an insulative surface extending between and contacting the anode and the outer cathode portion is coplanar with an upper surface of the anode.

5. The ion source of claim 1, further comprising at least one magnet at least partially located adjacent the inner cathode portion and located in an aperture defined in the anode as viewed from above and/or below.

6. The ion source of claim 1, further comprising a heat sink which surrounds three sides of the anode as viewed cross sectionally.

7. The ion source of claim 1, wherein the ion source is a cold cathode closed drift ion source.

8. The ion source of claim 1, wherein the inner cathode portion and the outer cathode portion are of the same conductive material.

9. The ion source of claim 1, wherein gas is introduced to the ion source from a side thereof closest to a substrate toward which ions from the source are to be directed.

10. The ion source of claim 1, wherein an upper surface of the anode is substantially coplanar with an upper surface of the cathode.

11. An ion source comprising:
    a conductive cathode comprising an inner cathode portion and an outer cathode portion in a given plane;

an ion emitting gap formed at least partially between the inner cathode portion and the outer cathode portion;
an anode located between the inner cathode portion and the outer cathode portion as viewed from above and/or below;
wherein no portion of the inner cathode portion overlaps the anode, and no portion of the outer cathode portion overlaps the anode; and
wherein an insulative surface extending between and contacting the anode and the inner cathode portion is coplanar with an upper surface of the anode.

12. An ion source comprising:
a conductive cathode comprising an inner cathode portion and an outer cathode portion in a given plane;
an ion emitting gap formed at least partially between the inner cathode portion and the outer cathode portion;
an anode located between the inner cathode portion and the outer cathode portion as viewed from above and/or below;
wherein no portion of the inner cathode portion overlaps the anode, and no portion of the outer cathode portion overlaps the anode; and
wherein a recess is defined on a side of the ion source closest to a substrate toward which ions from the source are to be directed, and wherein the recess is at least partially defined by each of the anode and cathode.

13. The ion source of claim 12, wherein an ion emitting gap of the ion source is at least partially defined by the recess.

14. The ion source of claim 12, wherein a bottom side of the recess has no air gap and is formed by a continuous surface include surfaces of the anode, cathode and an insulator.

15. An ion source comprising:
a conductive cathode comprising an inner cathode portion and an outer cathode portion in a given plane;
an ion emitting gap formed at least partially between the inner cathode portion and the outer cathode portion;
an anode located between the inner cathode portion and the outer cathode portion as viewed from above and/or below;
wherein no portion of the inner cathode portion overlaps the anode, and no portion of the outer cathode portion overlaps the anode; and
further comprising an insulator which surrounds three sides of the anode as viewed cross sectionally.

16. An ion source comprising:
an anode and a cathode;
wherein a first one of the anode and cathode comprises an inner electrode portion and an outer electrode portion;
the other of the anode and cathode being located at least partially between the inner electrode portion and the outer electrode portion as viewed from above and/or below, and wherein the ion source produces an ion beam directed toward a substrate; and
wherein no portion of the inner electrode portion and/or outer electrode portion overlaps the other of the anode and cathode.

17. The ion source of claim 16, wherein an upper surface of the other of the anode and cathode defines a plane which extends through the first one of the anode and cathode.

18. The ion source of claim 16, wherein gas is introduced to the ion source from a side thereof closest to a substrate toward which ions from the source are to be directed.

19. An ion source comprising:
a conductive cathode comprising an inner cathode portion and an outer cathode portion in a given plane;
an anode located between the inner cathode portion and the outer cathode portion as viewed from above and/or below, and wherein the ion source produces an ion beam directed toward a substrate; and
wherein at least part of the anode is located at an elevation above a bottom-most portion of the inner cathode portion and/or the outer cathode portion, so that at least part of the anode is located directly between the inner cathode portion and the outer cathode portion.

20. The ion source of claim 19, wherein an upper surface of the anode defines a plane which extends through a central portion of at least the inner cathode portion.

21. The ion source of claim 19, wherein an area between the anode and the cathode is provided with a ceramic insulator.

22. The ion source of claim 19, further comprising at least one magnet at least partially located adjacent the inner cathode portion and located in an aperture defined in the anode as viewed from above and/or below.

23. The ion source of claim 19, wherein the ion source is a cold cathode closed drift ion source.

24. The ion source of claim 19, wherein the inner cathode portion and the outer cathode portion are of the same conductive material.

25. An ion source comprising:
a conductive cathode comprising an inner cathode portion and an outer cathode portion in a given plane;
an anode located between the inner cathode portion and the outer cathode portion as viewed from above and/or below, and wherein the ion source produces an ion beam directed toward a substrate; and
wherein no portion of the inner cathode portion and/or outer cathode portion overlaps the anode.

26. The ion source of claim 25, wherein an upper surface of the anode defines a plane which extends through a central portion of at least the inner cathode portion.

27. The ion source of claim 25, wherein an upper surface of the anode is substantially coplanar with an upper surface of the cathode.

28. The ion source of claim 25, wherein an area between the anode and the cathode is provided with a ceramic insulator.

29. The ion source of claim 25, wherein an insulative surface extending between and contacting the anode and the outer cathode portion is coplanar with an upper surface of the anode.

30. An ion source comprising:
a conductive cathode comprising an inner cathode portion and an outer cathode portion in a given plane;
an anode located between the inner cathode portion and the outer cathode portion as viewed from above and/or below;
wherein no portion of the inner cathode portion and/or outer cathode portion overlaps the anode; and
wherein an insulative surface extending between and contacting the anode and the inner cathode portion is coplanar with an upper surface of the anode and/or an upper surface of the cathode.

31. An ion source comprising:
a conductive cathode comprising an inner cathode portion and an outer cathode portion in a given plane;
an anode located between the inner cathode portion and the outer cathode portion as viewed from above and/or below;
wherein at least part of the anode is located at an elevation above a bottom-most portion of the inner cathode portion and/or the outer cathode portion, so that at least part of the anode is located directly between the inner cathode portion and the outer cathode portion; and wherein an insulative surface extending between and contacting the anode and the inner cathode portion is coplanar with an upper surface of the anode.

32. An ion source comprising:

a conductive cathode comprising an inner cathode portion and an outer cathode portion in a given plane;

an anode located between the inner cathode portion and the outer cathode portion as viewed from above and/or below;

wherein at least part of the anode is located at an elevation above a bottom-most portion of the inner cathode portion and/or the outer cathode portion, so that at least part of the anode is located directly between the inner cathode portion and the outer cathode portion; and wherein a recess is defined on a side of the ion source closest to a substrate toward which ions from the source are to be directed, and wherein the recess is at least partially defined by each of the anode and cathode.

33. The ion source of claim 32, wherein an ion emitting gap of the ion source is at least partially defined by the recess.

34. The ion source of claim 32, wherein a bottom side of the recess has no air gap and is formed by a continuous surface include surfaces of the anode, cathode and an insulator.

35. The ion source of claim 32, further comprising an insulator which surrounds three sides of the anode as viewed cross sectionally.

* * * * *